United States Patent [19]
Yamaguchi et al.

[11] Patent Number: 4,876,214
[45] Date of Patent: Oct. 24, 1989

[54] METHOD FOR FABRICATING AN ISOLATION REGION IN A SEMICONDUCTOR SUBSTRATE

[75] Inventors: Tadanori Yamaguchi, Hillsboro; Evan Patton; Eric Lane, both of Portland; Simon Yu, Beaverton, all of Oreg.

[73] Assignee: Tektronix, Inc., Beaverton, Oreg.

[21] Appl. No.: 201,491

[22] Filed: Jun. 2, 1988

[51] Int. Cl.$^4$ .................... H01L 21/265; H01L 21/76
[52] U.S. Cl. ..................................... 437/038; 437/67; 437/72
[58] Field of Search ................. 437/67, 69, 72, 73, 437/38

[56] References Cited

U.S. PATENT DOCUMENTS

| | | | |
|---|---|---|---|
| 4,256,514 | 3/1981 | Pogge | 156/643 |
| 4,381,956 | 5/1983 | Lane | 437/72 |
| 4,396,460 | 8/1983 | Tamaki et al. | 156/653 |
| 4,454,646 | 6/1984 | Joy et al. | 156/643 |
| 4,454,647 | 6/1984 | Joy et al. | 156/643 |
| 4,463,493 | 8/1984 | Momose | 29/576 |
| 4,473,598 | 9/1984 | Ephrath et al. | 427/86 |
| 4,509,249 | 4/1985 | Goto et al. | 29/576 |
| 4,519,128 | 5/1985 | Chesebro et al. | 29/576 |
| 4,528,047 | 7/1985 | Beyer et al. | 156/643 |
| 4,554,728 | 11/1985 | Shepard | 437/67 |
| 4,639,288 | 1/1987 | Price et al. | 156/643 |
| 4,663,832 | 5/1987 | Jambotkar | 437/67 |

FOREIGN PATENT DOCUMENTS

| | | | |
|---|---|---|---|
| 56-137648 | 10/1981 | Japan | 437/69 |
| 57-196544 | 12/1982 | Japan | 437/72 |
| 58-140137 | 8/1983 | Japan | 437/67 |
| 61-135136 | 6/1986 | Japan | 437/72 |
| 61-137338 | 6/1986 | Japan | 437/72 |

Primary Examiner—Olik Chaudhuri
Attorney, Agent, or Firm—Daniel J. Bedell

[57] ABSTRACT

An isolation region is fabricated in a silicon substrate by first forming a silicon dioxide insulating layer on the substrate. A silicon nitride mask layer and an oxide layer are then deposited on the insulating layer. The oxide, mask and insulating layers and the substrate are etched to form a trench in the substrate. A channel stopper is implanted in substrate below the trench and the oxide layer is then stripped. Thereafter, the trench surface is oxidized to extend the insulating layer into the trench. Next, the trench is partially filled with polysilicon material, the surface of which is initially oxidized to extend the insulating layer over the trench. The mask layer is etched back to expose portions of the insulating layer adjacent the trench. The upper surface of the polysilicon material in the trench and portions of the substrate beneath exposed portions of the insulating layer are further oxidized to thicken the insulating layer over the trench.

18 Claims, 4 Drawing Sheets

METHOD FOR FABRICATING AN ISOLATION REGION IN A SEMICONDUCTOR SUBSTRATE

BACKGROUND OF THE INVENTION

The present invention relates to a method for fabricating a region for isolating electronic devices formed in a semiconductor substrate, and in particular to a method for providing an isolation region having a smooth upper surface.

In an integrated circuit where many devices reside on the same semiconductor substrate, regions in the substrate surround the devices to isolate them from each other. In the well-known "isolation with oxide and polycrystalline silicon" technology, a trench is etched into a silicon substrate around an area. The inner surface of the trench is oxidized to form an insulating layer and the trench is filled with polycrystalline silicon (polysilicon). The exposed surface of the polysilicon near the top of the trench is covered with another insulating layer. The insulating layer above the trench isolates a later deposited polysilicon or other conductive layer from the polysilicon in the trench. A conductive layer above the trench is normally etched to provide signal paths over the trench for interconnecting a device fabricated in the isolated area with other devices of the integrated circuit.

The insulating layer above the aforementioned trench should have a smooth surface free of grooves. Otherwise when a conductive layer deposited on the insulating layer is etched to form signal paths over the trench, conductive material remaining in the grooves can cause unwanted shorts between signal paths.

U.S. Pat. No. 4,509,249, entitled "METHOD FOR FABRICATING ISOLATION REGION IN SEMICONDUCTOR DEVICE", issued Apr. 9, 1985 to Goto et al., discloses two methods for fabricating an isolation trench. In the first method, an insulating layer is formed above the trench by oxidizing the polysilicon in the trench. Goto et al teach that an insulating layer formed by oxidation has an irregular surface and therefore recommend another method for forming the insulating layer. In the recommended method, a thick insulating layer of silicon dioxide is deposited (rather than formed by oxidation) on the polysilicon. Goto et al point out that the second method yields a smoother upper surface on the insulating layer above the trench than when the insulating layer is formed by oxidation. However, when the silicon dioxide insulating layer is deposited on the polysilicon in the trench, it is also deposited everywhere else on the substrate and must be etched back. The process of forming the silicon dioxide insulating layer over the trench by deposition and etching is more complex and expensive than forming the insulation layer simply by oxidizing the polysilicon. In addition, the etchback process must be carefully controlled to avoid leaving a central depression in the insulating layer that can cause unwanted shorts in the integrated circuit.

SUMMARY OF THE INVENTION

In accordance with an aspect of the invention, a region for isolating semiconductor devices formed in a semiconductor substrate is fabricated by first oxidizing a surface of the substrate to form an insulating layer. Silicon nitride and unannealed low pressure chemical vapor deposition (LPCVD) oxide mask layers are deposited on the insulation layer and a trench is etched through the mask and insulating layers and into the semiconductor substrate, wherein the trench surrounds an area of the substrate to be isolated. Dopant ions are then implanted into the semiconductor substrate at the bottom of the trench to form a channel stopper, but the mask layers prevent implantation of dopant ions elsewhere within the substrate. Thereafter, exposed inner surfaces of the trench within the silicon substrate are oxidized to extend the insulating layer into the trench. The trench is partially filled with polysilicon and the upper surface of the polysilicon material is oxidized to extend the insulating layer across the trench. A portion of the mask layer adjacent the oxidized surface of the polysilicon material is etched away to expose a portion of the insulating layer near the trench. The surface of the polysilicon material and the substrate beneath exposed portions of the insulating layer are further oxidized to thicken the insulating layer above and near the top of the trench, and the remaining portions of the mask layer are then stripped.

The channel stopper and the insulating layer surrounding the polysilicon in the trench form an isolation region impeding carrier flow between electronic devices incorporated into the substrate on either side of the trench. When fabricated by this method, the upper surface of the thickened insulating layer above the trench is smooth and free of grooves. During later stages of fabrication of the integrated circuit, polysilicon or other conductive material may be deposited on the insulating layer and etched to form conductive paths over the isolation region. Since the surface of the insulating layer is free of grooves, conductive material deposited thereon is substantially uniform in thickness and does not form unwanted shorting paths in grooves after etching.

Accordingly, it is an object of the present invention to provide an improved method for fabricating an isolation region in a semiconductor substrate so that the region has a smooth surface.

The subject matter of the present invention is particularly pointed out and distinctly claimed in the concluding portion of this specification. However, both the organization and method of operation of the invention, together with further advantages and objects thereof, may best be understood by reference to the following description in view of the accompanying drawings wherein like reference characters refer to like elements.

DESCRIPTION OF THE PREFERRED EMBODIMENT

The present invention relates to a method for fabricating an isolation region between electronic devices of an integrated circuit formed in a semiconductor substrate. The substrate may, for example, comprise various layers of p and n type silicon semiconductor material created by diffusion or epitaxial growth processes. The p and n type layers provide junctions for transistors or other semiconductor devices of an integrated circuit. FIGS. 1–14 show a portion of such a substrate 10 in sectional view and illustrate how an isolation region is fabricated in accordance with the invention.

Figure 1:
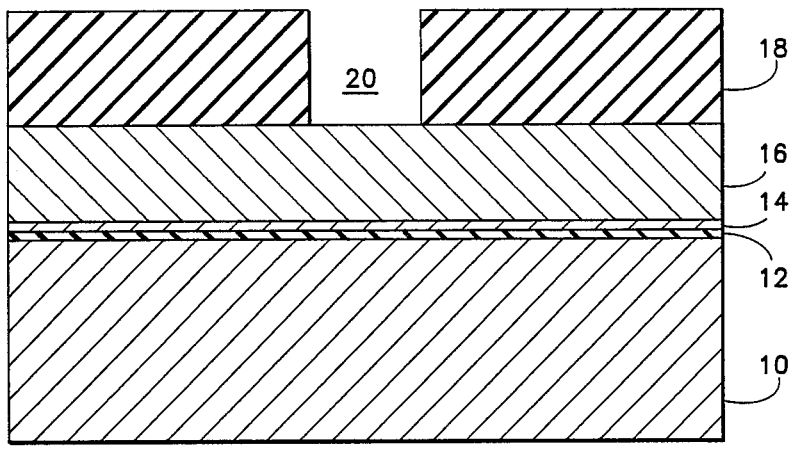
FIGS. 1–14 comprise sectional views of a portion of a semiconductor substrate during successive stages of fabrication in accordance with the invention of an isolation region within the substrate.

Referring to FIG. 1, the surface of substrate 10 is initially oxidized to form an insulating layer 12 of silicon dioxide. A mask layer 14 of silicon nitride, a layer 16 of unannealed chemical vapor deposition (CVD) oxide, and a layer 18 of photoresist material are then successively deposited on insulating layer 12. The photoresist layer 18 is etched by a well-known photolithographic technique to form a trench 20 extending down to the upper surface of oxide layer 16. Trench 20 is configured to surround an area of the semiconductor substrate which is to be isolated. Trench 20 is preferably not wider than 2 microns, e.g. it is suitably 1.5 microns wide.

Figure 2:
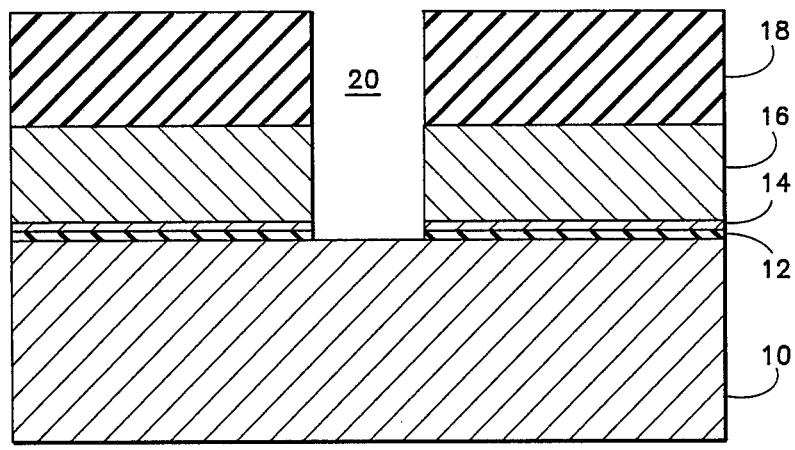
Figure 3:
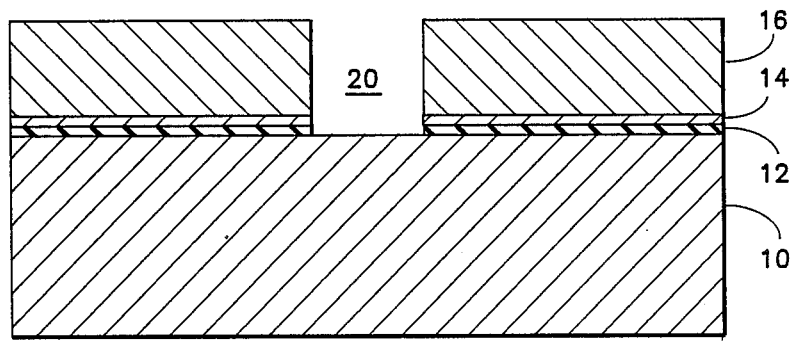
Figure 4:
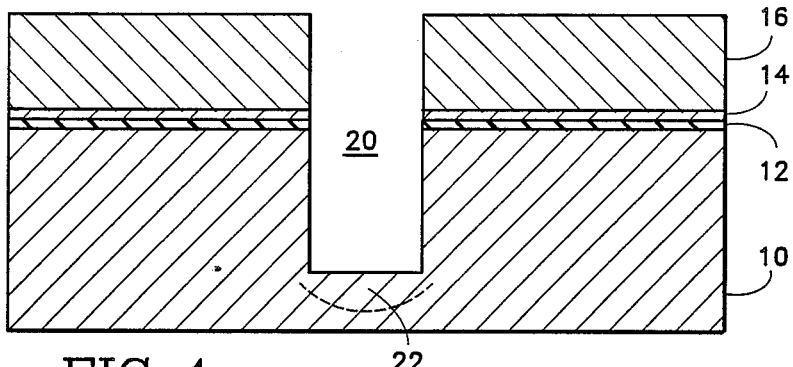
Figure 5:
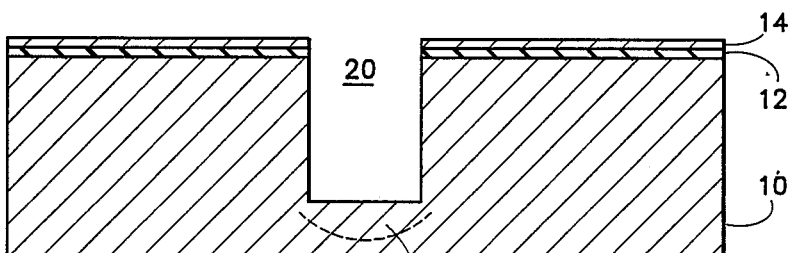

With the remaining portions of photoresist layer 18 and silicon nitride layer 14 used as a mask, trench 20 is extended by a conventional first reactive ion etching process down through layers 16, 14 and 12 to the upper surface of substrate 10 (FIG. 2). The first reactive ion etching process suitably employs a mixture of $CHF_3$ and $O_2$ as an etching agent. The photoresist layer 18 is then stripped (FIG. 3), and trench 20 is extended preferably 4-6 microns into substrate 10 by a second reactive ion etching process using the oxide layer 16 and silicon nitride layer 14 as a mask (FIG. 4). The second reactive ion etching process suitably employs a mixture of $SiCl_4$ and He as an etching agent. Dopant ions such as boron are implanted at the bottom of trench 20 to form a channel stopper region 22 in the substrate. The silicon nitride layer 14 and oxide layer 16 again act as self-aligned masks during ion implantation to prevent ions from being implanted elsewhere in the semiconductor substrate 10. The channel stopper region 22 impedes carrier flow along the under surface of the trench. The oxide layer 16 is then stripped (FIG. 5) suitably using buffered HF. Since the oxide layer 16 is unannealed LPCVD oxide ($SiO_x$) which is much less dense and much more reactive than the thermal $SiO_2$ insulating layer 12, layer 16 etches substantially faster than layer 12. Thus, the strip process does not substantially undercut layer 14.

Figure 6:
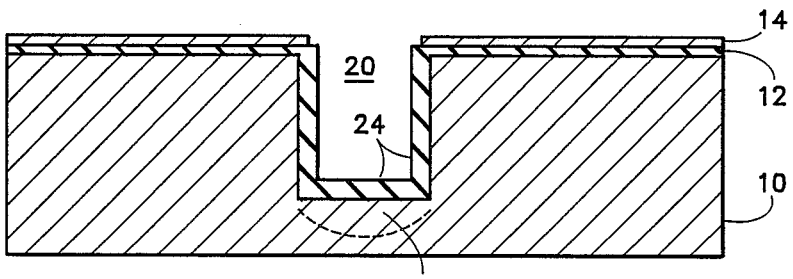
Figure 7:
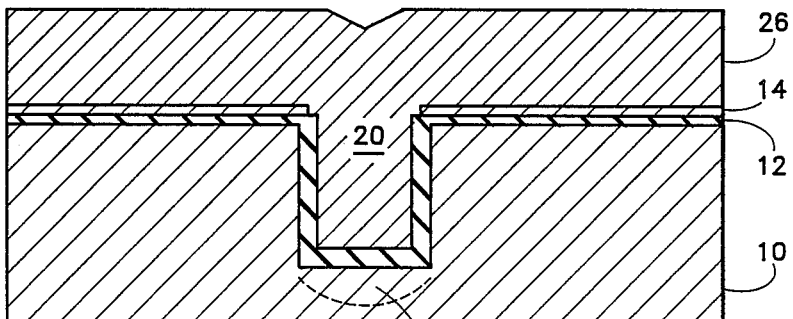
Figure 8:
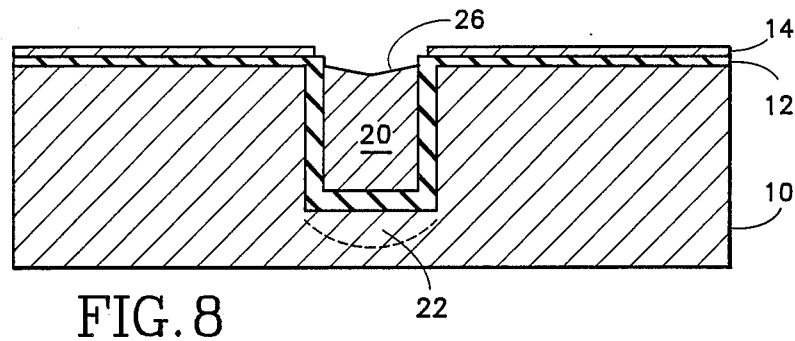
Figure 9:
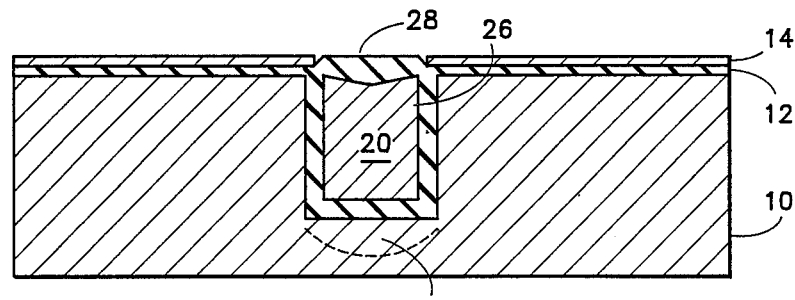

The inner surface 24 of trench 20 is next oxidized to extend the insulating silicon dioxide layer 12 inside the trench (FIG. 6). Polysilicon material 26 is deposited in trench 20 and over mask layer 14 (FIG. 7). Thereafter, the deposited polysilicon material 26 is etched back from mask layer 14 and from an upper portion of trench 20 (FIG. 8). $CF_3Br + SF_6$ is a suitable etching agent. The nitride layer 14 acts as an etch stop. The upper surface of polysilicon material 26 is oxidized (FIG. 9) to extend the insulating layer 12 across trench 20. The oxidation process is halted when the upper surface 28 of insulating layer 12 rises above trench 20 approximately to the level of the upper surface of portions of layer 12 adjacent trench 20, or to a slightly higher level. FIG. 9 illustrates the upper surface 28 of insulating layer 12 over trench 20 as being slightly elevated.

Figure 10:
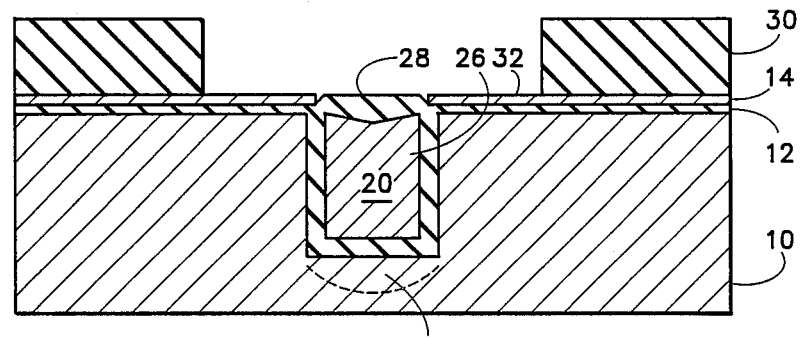
Figure 11:
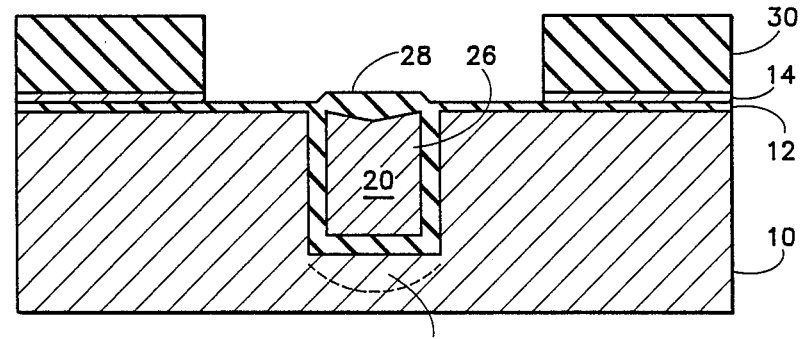
Figure 12:
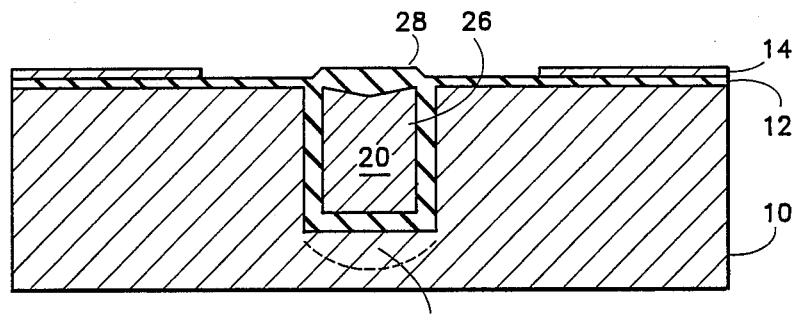
Figure 13:
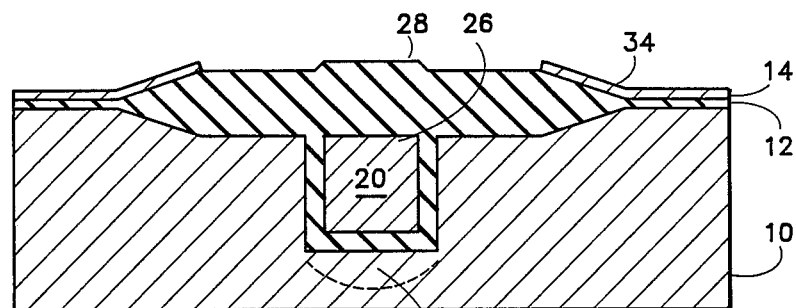
Figure 14:
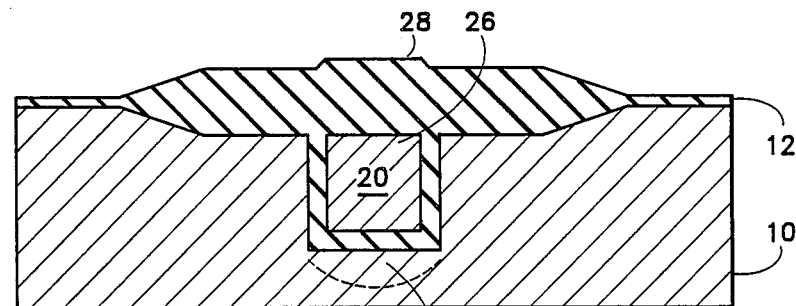

After the polysilicon is oxidized, another layer 30 of photoresist material is deposited on mask layer 14. Portions of layer 30 are etched by photolithographic technique to expose the surface 28 of the silicon dioxide insulating layer 12 above trench 20 and to expose portions 32 of mask layer 14 adjacent surface 28 (FIG. 10). Using layer 30 as a mask, the exposed portions of silicon nitride layer 14 are now removed by reactive ion etching (FIG. 11) and the remaining portions of layer 30 are then stripped from mask layer 14 (FIG. 12). Thereafter, the surface of substrate 10 beneath the exposed portions of the surface 28 of insulating layer 12 and beneath nearby portions 34 of mask layer 14 are further oxidized to thicken insulating layer 12 above and adjacent trench 20 (FIG. 13). Mask layer 14 is then stripped from insulating layer 12 (FIG. 14). Polysilicon material 26, the surrounding insulating layer 12, and the channel stopper region 22 below trench 20 form an isolation region that impedes carrier flow between devices fabricated in substrate 10 on opposite sides of the isolation region. As may be seen in FIG. 14, the upper surface 28 of the insulating oxide layer 12 above and adjacent trench 20 is somewhat convex rather than flat, but is nonetheless smooth and free of grooves. During later stages of fabrication of an integrated circuit, polysilicon or other conductive material may be deposited on surface 28 and photolithographically defined and reactive ion etched to form conductive paths over the isolation region for interconnecting various devices in the integrated circuit. Since surface 28 is smooth and free of grooves, conductive material deposited thereon is substantially uniform in thickness and does not form unwanted shorting paths after etching.

While a preferred embodiment of the present invention has been illustrated and described, it will be apparent to those skilled in the art that many changes and modifications may be made without departing from the invention in its broader aspects. The appended claims are therefore intended to cover all such changes and modifications as fall within the true spirit and scope of the invention.

We claim:

1. A method for fabricating an isolation region in a semiconductor substrate comprising the steps of:
   forming antiinsulating layer on said substrate;
   forming a mask layer on said insulating layer;
   forming a trench in said mask layer, said insulating layer and said substrate;
   oxidizing an inner surface of said trench to extend said insulating layer into said trench;
   filling a portion of said trench with semiconductor material;
   initially oxidizing an upper surface of said semiconductor material to extend said insulating layer over said trench;
   removing portions of said mask layer to expose portions of said insulating layer adjacent said trench; and
   further oxidizing said upper surface of said semiconductor material and portions of said substrate adjacent said trench.

2. The method in accordance with claim 1 wherein said step of initially oxidizing an upper surface of said semiconductor material is halted when an upper surface of said insulating layer over said trench is approximately even with an upper surface of said insulating layer adjacent said trench.

3. The method in accordance with claim 1 wherein said step of initially oxidizing an upper surface of said semiconductor material is halted as an upper surface of said insulating layer over said trench rises above an upper surface of said insulating layer adjacent said trench.

4. The method in accordance with claim 1 wherein said trench is less than 2 microns wide.

5. The method in accordance with claim 4 wherein said trench is approximately 4-6 microns deep within said substrate.

6. The method in accordance with claim 1 wherein said step of forming a trench in said mask layer, said insulating layer and said substrate comprises the substeps of:
  forming a second layer of insulating material on said mask layer;
  etching the second layer of insulating material, the mask layer, the insulating layer and the substrate to form said trench; and
  stripping said second layer from said mask layer.

7. The method in accordance with claim 6 wherein said second layer of insulating material comprises unannealed chemical vapor deposition oxide.

8. A method for fabricating an isolation region in a semiconductor substrate comprising the steps of:
  forming an insulating layer on said substrate;
  forming a mask layer on said insulating layer;
  forming a trench extending through said mask and insulating layers and into said semiconductor substrate;
  implanting dopant ions into said semiconductor substrate below said trench;
  oxidizing an inner surface of said trench to extend said insulating layer into said trench;
  filling a portion of said trench with semiconductor material;
  initially oxidizing an upper surface of said semiconductor material in said trench to extend said insulating layer over said trench;
  removing portions of said mask layer adjacent the oxidized surface of said semiconductor material to expose portions of said insulating layer adjacent said trench; and
  further oxidizing said upper surface of said semiconductor material and portions of said substrate adjacent said trench.

9. The method in accordance with claim 8 wherein said step of initially oxidizing an upper surface of said semiconductor material is halted when an upper surface of said insulating layer over said trench is approximately even with an upper surface of said insulating layer adjacent said trench.

10. The method in accordance with claim 8 wherein said step of initially oxidizing an upper surface of said semiconductor material is halted as an upper surface of said insulating layer over said trench rises above an upper surface of said insulating layer adjacent said trench.

11. The method in accordance with claim 8 wherein said trench is less than 2 microns wide.

12. The method in accordance with claim 11 wherein said trench is 4–6 microns deep within said substrate.

13. The method in accordance with claim 8 wherein said step of forming a trench through said mask and insulating layers and into said substrate comprises the substeps of:
  forming a second layer of insulating material on said mask layer;
  etching the second layer of insulating material, the mask layer, the insulating layer and the substrate to form said trench; and
  stripping said second layer from said mask layer.

14. The method in accordance with claim 13 wherein said second layer of insulating material comprises unannealed chemical vapor deposition oxide.

15. A method for fabricating an isolation region in a silicon substrate comprising the steps of:
  forming a silicon dioxide insulating layer on said substrate;
  forming a mask layer on said insulating layer;
  forming an oxide layer on said mask layer;
  etching the oxide layer, the mask layer, the insulating layer and the substrate to form a trench in said substrate;
  stripping said oxide layer from said mask layer;
  oxidizing an inner surface of said trench to extend said insulating layer into said trench;
  filling a portion of said trench with polysilicon material;
  initially oxidizing said polysilicon material to extend said insulating layer over said trench, oxidation of said polysilicon material continuing until an upper surface of said trench rises above an upper surface of said insulating layer adjacent said trench;
  removing portions of said mask layer to expose portions of said insulating layer adjacent said trench; and
  further oxidizing said upper surface of said polysilicon material and portions of said substrate adjacent said trench.

16. The method in accordance with claim 15 wherein said trench is less than 2 microns wide and is approximately 4–6 microns deep within said substrate.

17. The method in accordance with claim 15 wherein said oxide layer comprises unannealed chemical vapor deposition oxide.

18. The method in accordance with claim 17 further comprising the step of implanting dopant ions into said semiconductor substrate below said trench before the step of stripping said oxide layer from said mask layer.

* * * * *

UNITED STATES PATENT AND TRADEMARK OFFICE
CERTIFICATE OF CORRECTION

PATENT NO.   :   4,876,214
DATED        :   October 24, 1989
INVENTOR(S)  :   Tadanori Yamaguchi et al It is certified that error appears in the above-identified patent and that said Letters Patent is hereby corrected as shown below:

In the Claims:

Column 4, line 33 reads "antiinsulating" should be --an insulating--.

Signed and Sealed this

Eighteenth Day of September, 1990

Attest:

HARRY F. MANBECK, JR.

*Attesting Officer*          *Commissioner of Patents and Trademarks*